(12) United States Patent
Payne

(10) Patent No.: US 6,210,175 B1
(45) Date of Patent: Apr. 3, 2001

(54) SOCKET RAILS FOR STACKING INTEGRATED CIRCUIT COMPONENTS

(75) Inventor: David M. Payne, Meridian, ID (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/026,570

(22) Filed: Feb. 20, 1998

(51) Int. Cl.⁷ .................................................. H01R 12/00
(52) U.S. Cl. ................................................ 439/69; 439/70
(58) Field of Search ............................. 439/69, 70, 72; 361/735; 257/686, 777

(56) References Cited

U.S. PATENT DOCUMENTS

| | | | |
|---|---|---|---|
| 3,853,382 | * | 12/1974 | Lezar . |
| 4,116,519 | * | 9/1978 | Grabbe et al. . |
| 4,137,559 | * | 1/1979 | Reuting . |
| 4,364,620 | * | 12/1982 | Mulholland et al. . |
| 4,710,134 | * | 12/1987 | Korsunsky ............................. 439/70 |
| 5,347,215 | * | 9/1994 | Armstrong et al. ................... 439/72 |
| 5,754,408 | * | 5/1998 | Derouiche ............................ 361/773 |

FOREIGN PATENT DOCUMENTS 3-44995 * 2/1991 (JP) ....................................... 439/78

* cited by examiner

Primary Examiner—Neil Abrams

(57) ABSTRACT

A circuit board includes a semiconductor socket which permits insertion of gull wing semiconductor integrated circuit devices with gull wing contacts. The socketed devices are retained in an inverted alignment. Ribs are used to align the gull wing contacts and ridges are used to isolate split contacts. The isolation of the split contacts permits the use of aligned leads of different ones of the stacked devices. The socket may be mounted beneath the circuit board. This permits stacking and/or socketing of such integrated circuit devices, and further permits alignment of such socketed devices beneath similar devices which are surface mounted to the circuit board, by mounting the socket on the circuit board's opposite (backplane) side. In one configuration, multiple integrated circuit devices may be inserted into the socket in a stacked arrangement. The socket permits the socketing of integrated devices which are packaged for fusion bonding applications. The socket may be provided with soft material for the purpose of permitting good ohmic contact, and may further be provided with sufficient solder material for purposes of fusion bonding the integrated circuit devices subsequent to insertion.

16 Claims, 4 Drawing Sheets

SOCKET RAILS FOR STACKING INTEGRATED CIRCUIT COMPONENTS

FIELD OF THE INVENTION

This invention relates to electrical connectors. More particularly, it relates to a socket connector for receiving one or more semiconductor devices such as those supplied in gull wing package designs.

BACKGROUND OF THE INVENTION

Various types of semiconductor packages include external connector designs which are adaptable to fusion bonding (soldering), socketing or both. One package type which permits a high pin count and surface connection is the gull wing package. In a gull wing package, the leads splay outwardly from the package and can easily be thermally fused to the surface of a printed circuit board. The gull wing package has the advantages of high pin count or pin density, ease of assembly for surface mount applications and ease of inspection for surface mount applications. Unfortunately, it is not ideally suited for socketing.

Often it is desired to provide a semiconductor integrated circuit device part to a circuit board while permitting upgrading by connecting additional semiconductor integrated circuit devices by the user. Typically this is done with semiconductor memory, although processor enhancements and other additional circuitry are added to various circuits. Often such additions utilize common address circuit with the more basic circuit, and the circuit board is capable of addressing the additional semiconductor integrated circuit parts.

By "parts," it is the intent to describe a packaged integrated circuit device, which is provided in a package, which may be plastic or ceramic. The part can be a hybrid integrated circuit, or any other convenient packaged semiconductor integrated circuit part. The term "integrated circuit device" is intended to describe a complete packaged device, as customarily seen in a package such as a gull wing package.

Such additional integrated circuit devices are typically socketed, so that the user need not be skilled at soldering high density parts to accomplish the upgrade. In the past, if an integrated circuit device was originally supplied in a gull wing package, a different package type had to be provided for field upgrades, since the gull wing package was not readily installed subsequent to original assembly of the circuit board.

Circuit layouts also make it convenient to stack integrated circuit devices. If an integrated circuit devices is surface mounted, it is often difficult to further mount a socket over that integrated circuit devices, although the location of that integrated circuit devices presents the desired alignment of the interconnect circuitry for connection of further parts. Placing the integrated circuit devices on the reverse side of the board would be attractive, but parts are often not available in reverse pinout configurations. Therefore a reverse board mounting must accommodate a part installed upside down.

It would be advantageous if a semiconductor part having a high pin count and designed for surface mounting could also be socketed to a board for purposes of end user installation. It would be advantageous to be able to socket such a part in such a way that its pinout alignment matched that of the original, so it would not be necessary to provide a reverse pinout part. It would be advantageous to be able to accomplish stacking of integrated circuit devices parts without limiting the ability to provide a basic configuration of a circuit board with surface mounted integrated circuit devices. In doing so, it would be advantageous if a gull wing semiconductor package could be added to a circuit board after assembly, by socketing the gull wing package to the board.

In addition, in certain types of enhancements, such as increasing memory, it is desired to be able to stack the integrated circuit devices parts. Therefore, if a basic configuration had a memory capacity of x, the end user could add semiconductor integrated circuit devices to increase the capacity by using the same or different capacity integrated circuit devices parts which use the same basic pinout arrangement.

SUMMARY OF THE INVENTION

According to the present invention, a socket is provided in which lead ends of semiconductor integrated circuits engage sidewalls of terminals on the socket, and in which the contour of the socket guides the lead ends. This design permits the socket to accept gull wing semiconductor integrated circuit devices in an inverted ("dead bug") alignment. The ability to provide socketing of gull wing parts permits the use of parts with high pin count density to be socketed, and thereby facilitates selective upgrading and part substitution without a requirement for fusion bonding on upgrading.

In accordance with one embodiment of the invention, the socket accepts multiple integrated circuit devices in a stacked arrangement. A plurality of terminations of the multiple integrated circuit devices are connected in common, by engaging common terminals on the socket. In one configuration, at least one termination on the socket is segmented, so that at least two of the integrated circuit devices are separately signaled. In another configuration, the integrated circuit devices are provided with a variation in connection to their terminations so that different devices connected to the same terminals in the socket receive different signals. In another configuration, the devices are provided with unique addresses, so that it is possible to provide signals addressed to specific ones of several devices connected in parallel.

The invention permits the addition or modification of circuitry on a circuit board by placing the circuits in a stacked configuration. The invention further permits the use of gull wing integrated circuit devices for use in a socketed location.

One benefit of stacking parts is that this minimizes lead length of connections to the integrated circuit devices. The ability to reduce lead length provides better high frequency data transmission characteristics and results in less inductive impedance from the connection. The shorter lead lengths also reduce RF noise received by and transmitted from the circuit. The stacking also reduces the board real estate or footprint required for multiple parts. This benefit is realized by the vertical arrangement of parts and by the use of short conductor runs between commonly addressed terminals.

In many such parts, different addresses between parts can be achieved by changes to one or more pins. Therefore, it would be possible to produce parts with the same basic pinout configuration, but still allow differentiation of parts. This could be achieved, for example, by providing redundant pins and clipping individual ones of the redundant pins. This would mean that the clipped part would only respond to the cognizant address signal when it appeared at an unclipped pin.

It is possible to vertically separate parts for separate addressing. This is accomplished by providing address separation partitions. Alternatively, multiple parts can be stacked by the use of separate sockets for each part and stacking the sockets as desired.

It is possible to provide each device with an address which is unique, at least to an extent that it is possible to discriminate between devices by address. The address can then be used to separately enable or disenable individual devices.

DETAILED DESCRIPTION OF THE INVENTION

Figure 1:
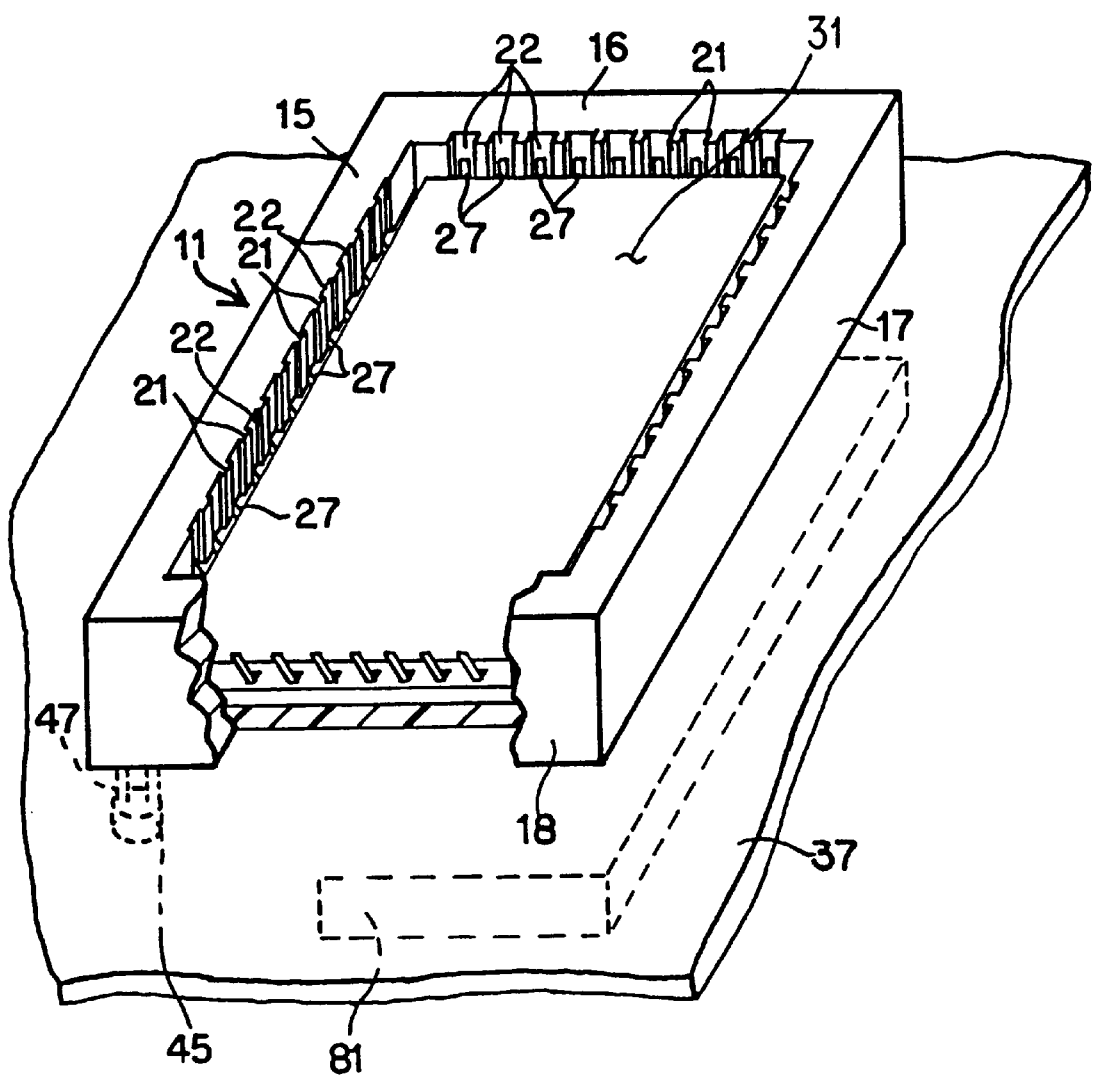
FIG. 1 shows a printed circuit board section in which a socket is provided for accepting gull wing semiconductor integrated circuit parts.

Referring to FIG. 1, a socket 11 is provided in which four sidewalls 15, 16, 17, 18 are provided with guide rails 21 separating individual contacts 22. While the example shown in FIG. 1 shows contacts 22 on each of the four sides 15–18, it is possible to use the present invention with parts having leads on two of the four sides. The contacts 22 are engaged by gull wing terminations 27 on semiconductor integrated circuit devices, such as device 31.

The socket 11 is in turn mounted to a printed circuit board 37.

The sidewalls 15–18 and contacts 22 preferably extend to a height which permits stacking multiple semiconductor integrated circuit devices (not separately shown). When used in this manner, it is generally necessary that each of the multiple integrated circuit devices connect differently, either because of changes in the internal circuitry of the integrated circuit device, different connection (pinout) circuitry, physical changes in the pinouts or an ability of the socket 11 to separately connect to predetermined terminations 27 of the individual integrated circuit devices 31.

If redundant terminations 27 are provided on the integrated circuit device, it is possible to simply remove selected terminations 27 from contact with a particular socket contact 22. Such changes can likewise be provided internally at the leadframe or within the circuitry of the integrated circuit chip embedded in the semiconductor device's package.

Barbed or flanged attachments, such as flanged attachment 45, are used to mechanically engage the socket 11 to the printed circuit board 37. The attachments engage holes 47 in the printed circuit board 37. This is useful to maintain alignment and also to retain the socket in position during solder attachment of the socket 11 to the board 37. Such an arrangement is particularly advantageous in mounting the socket 11 on the backplane side 85 (as shown in FIG. 3) of the printed circuit board 37.

Figure 2:
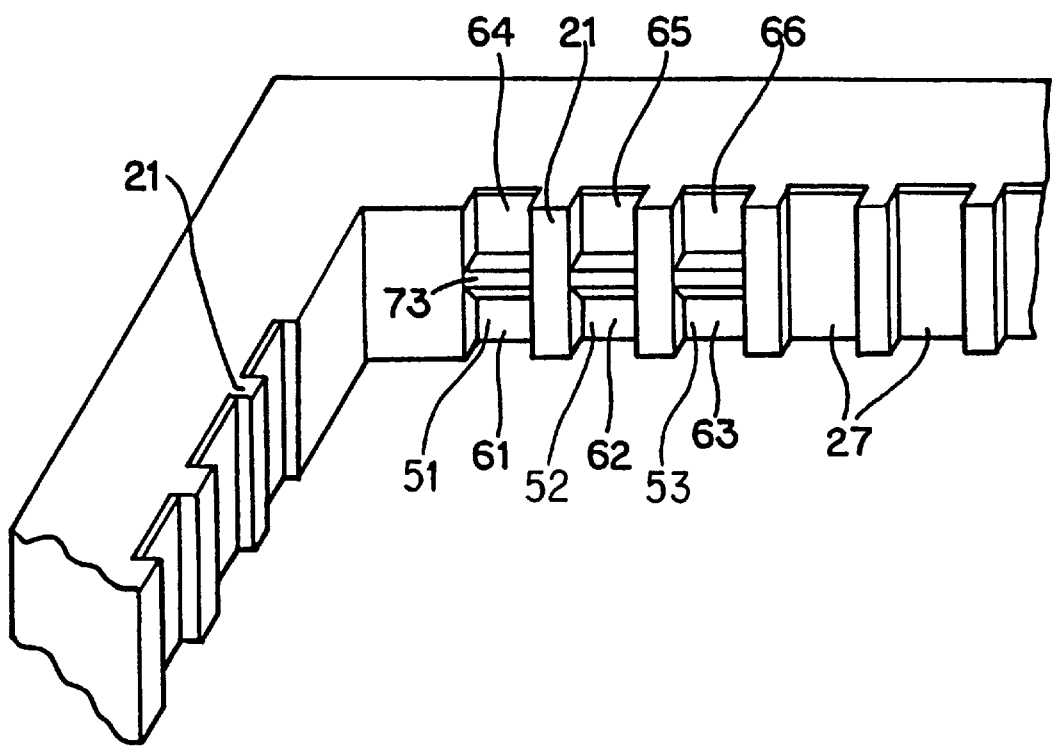
FIG. 2 shows a modification of the socket of FIG. 1, in which a segmented contact terminal is provided.

FIG. 2 shows an example of contacts 51–53 which are modified for separately contacting multiple semiconductor integrated circuit devices. Separate contact segments 61–66 are electrically isolated by lateral ridges 73 so that when semiconductor integrated circuit devices 31 are stacked, the leads 27 on sequential integrated circuit devices separately engage respective ones of the segments 61–63 or 64–66. This would normally only be used on a few of the contacts 51–53, since most of the pinouts of the stacked integrated circuit devices 31 can be expected to be connected in parallel between integrated circuit devices.

Separating each of the segments 61–66 are lateral ridges 73. This provides a physical separation between the segments which the leads 27 must pass, thereby electrically isolating the leads 27 between the stacked integrated circuit devices. Despite the fine separation and alignment of the leads on gull wing integrated circuit devices, it is possible to visually determine whether multiple leads 27 cross. It is also possible to determine through visual inspection if one or more leads is displaced more than its neighbors 27. This makes it possible to insert such devices into the socket with reasonable assurance that the devices 31 are properly connected.

Figure 3:
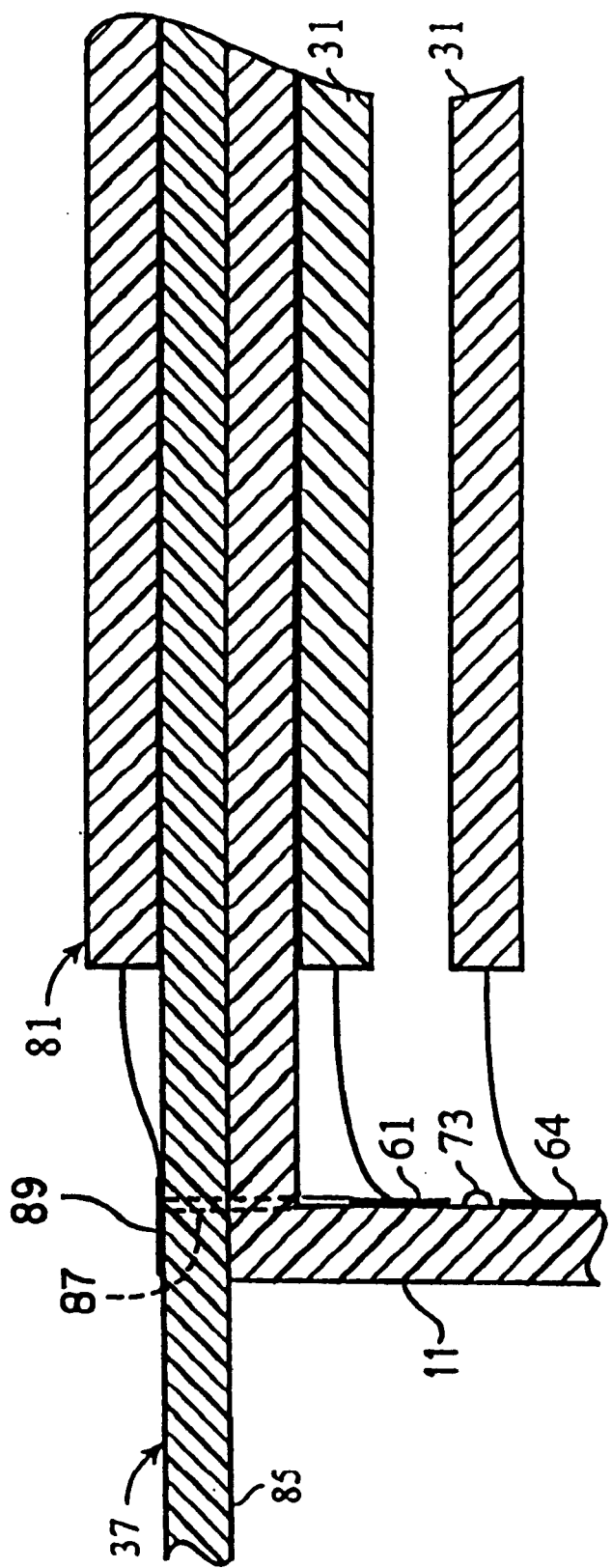
FIG. 3 is a cross-sectional view of the socket of FIG. 2, showing details of the split contacts.
Figure 4:
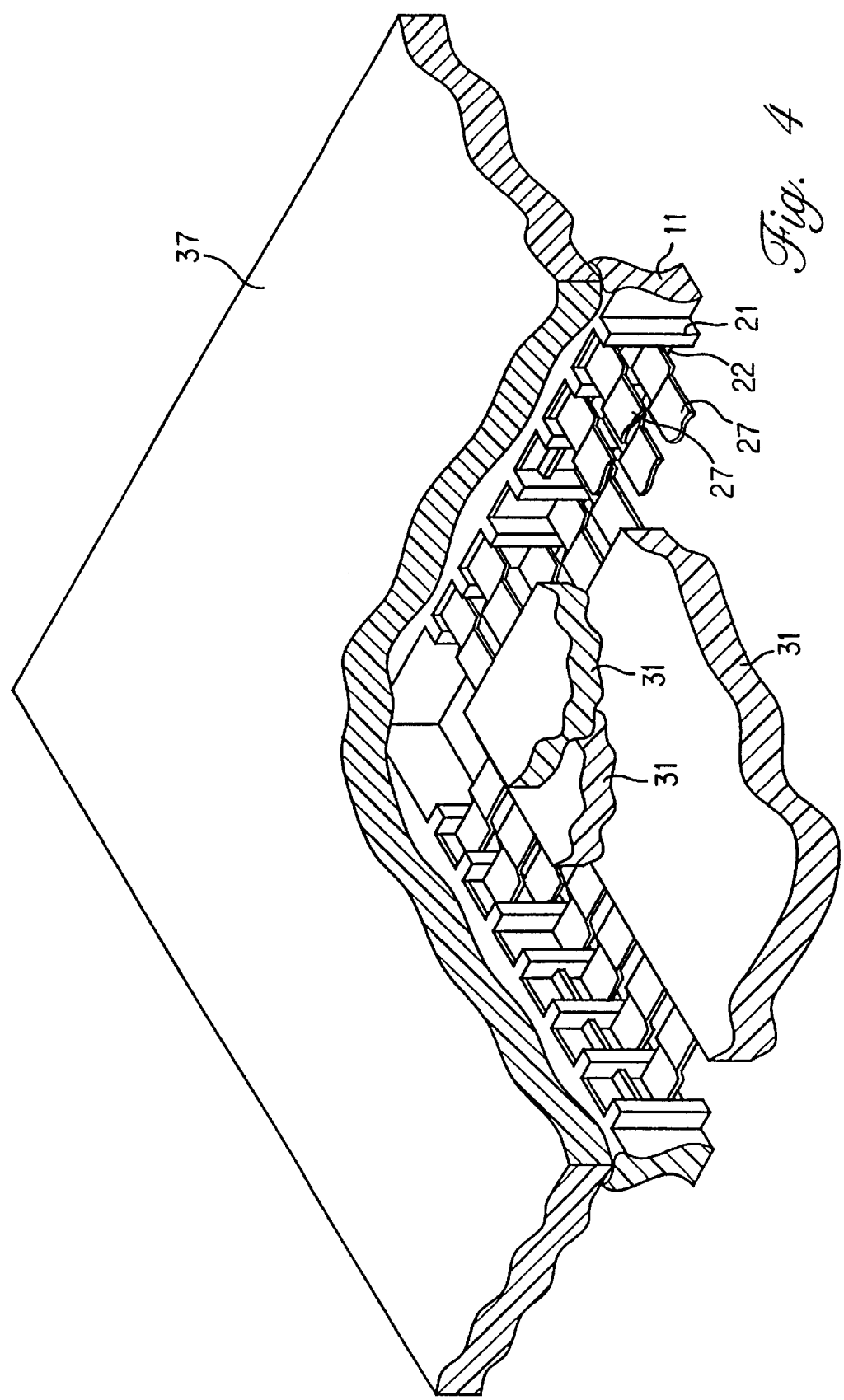
FIG. 4 shows details of socket connections according to one embodiment of the present invention.

Referring to FIGS. 3 and 4, the socket's ability to receive devices 31 in an inverted configuration permit the use of such a socket mounted on the circuit board 37 on an opposite side from a gull wing integrated circuit device 81 which is surface mounted to the board 37. Therefore, the socket 11 would be mounted on what is often referred to a the backplane side 85. The inverted socket 11 would have a terminal alignment which corresponds to that of the surface mounted integrated circuit device 81. This is convenient for the use of common terminals on the socket 11 and the surface mounted integrated circuit device 81, since the common terminals would be in substantial alignment. Circuit connections 87 of conductive material extend through the circuit board 37 providing electrical connection between common device terminals, such as device 81 contact pad 89 and socket terminal 61, for example. It is then possible to provide discrete addressing, if necessary, through discrete connection of one or more of the terminals, while connecting other terminals in parallel between the socketed and surface mounted devices. The ability to mount the socket 11 on the backplane 85 of the printed circuit board 37 is not intended to preclude the possibility of mounting the socket 11 on the top side of the printed circuit board 37. In such an arrangement, it is possible to form the integrated circuit devices 31 so that its pinouts align in inverted fashion.

Discrete addressing can also be provided through the semiconductor integrated circuit devices 31 themselves. It is possible to provide each device 31 with an address which is unique, at least to an extent that it is possible to discriminate between devices 31 by address. The address can then be used to separately enable or disenable individual devices 31. It is possible to provide redundant terminations 27 on the devices 31, and then selectively disconnect terminations 27 according to a desired address. It is common to provide multiple power connections or test terminations 27. By selectively applying power to individual ones of these connections, the device 31 can be provided with a discrete address. This permits such discrete addressing on devices 31 which are mass produced for applications which do not have such discrete addressing, by specifying that the particular termination 27 have a particular signal to either enable or disable the device 31. Thus it is possible to provide multiple address capability for a single mass produced integrated circuit device 31. It is also possible to provide integrated circuit devices 31 which are at the time of manufactured able to respond in a different manner from corresponding counterpart integrated circuit devices.

The invention is described in terms of socketing devices which are intended for fusion bonding in a surface mount environment. While it is possible to provide soft material for the purpose of permitting good ohmic contact, the socket 11 may further be provided with sufficient solder material that one can use heat to secure the device in the socket subsequent to inserting the device 31. This permits good ohmic contact while permitting the device 31 to be inserted subsequent to the primary assembly of the circuit board 37.

The contacts establish ohmic contact with the terminations 27. According to one embodiment of the present invention, this is accomplished by including surface material sufficiently soft so as to deform upon engagement with the splayed terminations. The soft, deformable material facilitates good ohmic contact. According to another embodiment of the invention, the surface material is provided with a capability of establishing a fusion bond subsequent to engagement with the splayed terminations. This permits fusion bonding subsequent to an initial assembly of the circuit board with its components.

What is claimed is:

1. A circuit board capable of accepting a semiconductor integrated circuit device, said integrated circuit device having a plurality of splayed terminations arranged for surface mounting of the semiconductor integrated circuit device, the circuit board comprising:

a. a mounting position on a first side of the circuit board for a first one of said semiconductor integrated circuit devices permitting fusion bonding of the semiconductor integrated circuit device for purposes of attachment to the circuit board;

b. a socket mounted on a second, opposite side of the circuit board and including a plurality of vertically oriented electrical connectors, the socket capable of accepting at least one additional semiconductor integrated circuit device in an inverted position whereby the splayed terminations extend outwardly and in a generally upward direction from a body portion of said additional semiconductor integrated circuit device, the splayed terminations being in ohmic contact with the electrical connectors when the additional semiconductor integrated circuit device is mounted in the socket, the electrical connectors including a surface material sufficiently soft so as to deform upon engagement with the splayed terminations, thereby facilitating ohmic contact, the socket in vertical alignment with the first one of the semiconductor integrated circuit devices, whereby said vertical alignment provides commonality of a plurality of circuit connections between the first one of the semiconductor integrated circuit devices and said additional integrated circuit device in the socket; and c. the socket including at least two sidewalls extending in a vertical direction, said electrical connectors being formed in an inside surface of said sidewalls, said sidewalls having a plurality of partitions separating said electrical connectors and extending in a vertical direction and inwardly toward the additional semiconductor integrated circuit device, thereby providing a guide for the splayed terminations of the additional semiconductor integrated circuit device.

2. The circuit board of claim 1, further comprising the socket having a depth sufficient to accept a plurality of additional semiconductor integrated circuit devices, including said one additional semiconductor integrated circuit device and further semiconductor integrated circuit devices in a stacked alignment and sharing a plurality of circuit connections.

3. The circuit board of claim 2, wherein said two sidewalls extend in a vertical direction sufficiently to accept the plurality of semiconductor integrated circuit devices and the vertical partitions extend sufficiently in the vertical direction to permit socketing the semiconductor integrated circuit devices to be accepted by the socket while maintaining separation of the splayed terminations from other splayed terminations on the same semiconductor integrated circuit device.

4. The circuit board of claim 3 wherein at least one connector location being split so as to separately communicate between vertically aligned splayed terminations on at least a pair of the semiconductor integrated circuit devices.

5. The circuit board of claim 1 the semiconductor integrated circuit devices include a discrete address, thereby permitting selective enablement of said semiconductor integrated circuit devices by use of the address while providing substantially identical signals to a plurality of said integrated circuit devices.

6. The circuit board of claim 1 wherein the electrical connectors include surface material capable of establishing a fusion bond subsequent to engagement with the splayed terminations, thereby permitting fusion bonding subsequent to an initial assembly of the circuit board with its components.

7. The circuit board of claim 1 wherein the socket comprises at least four sidewalls, each of which include electrical connectors for establishing ohmic contact with ones of said splayed terminations.

8. A circuit board capable of accepting a gull wing semiconductor integrated circuit device which has a plurality of splayed terminations arranged for surface mounting of the semiconductor integrated circuit device, the circuit board comprising:

a. a socket mounted on one side of the circuit board and including a plurality of vertically oriented electrical connectors, the socket capable of accepting said gull wing semiconductor integrated circuit device in an inverted position whereby the splayed terminations extend outwardly and in a generally upward direction from a body portion of the semiconductor integrated circuit device, the splayed terminations being in ohmic contact with the electrical connectors when the additional semiconductor integrated circuit device is mounted in the socket, the electrical connectors including a surface material sufficiently soft so as to deform upon engagement with the splayed terminations, thereby facilitating ohmic contact; and b. the socket including at least two sidewalls extending in a vertical direction, said electrical connectors being formed in an inside surface of said sidewalls, said sidewalls having a plurality of partitions separating said electrical connectors and extending in a vertical direction and inwardly toward the semiconductor integrated circuit device, thereby providing a guide for the splayed terminations of the semiconductor integrated circuit device.

9. The circuit board of claim 8, comprising a. a mounting position on another, opposite side of the circuit board for a first one of said semiconductor integrated circuit devices permitting fusion bonding of the semiconductor integrated circuit device for purposes of attachment to the circuit board; and b. said socket capable of accepting at least one additional semiconductor integrated circuit device in an inverted position whereby the splayed terminations extend outwardly and in a generally upward direction from a body portion of the semiconductor integrated circuit device, the splayed terminations being in ohmic contact with the electrical connectors when the additional semiconductor integrated circuit device is mounted in the socket, the socket in vertical alignment with the first one of the semiconductor integrated circuit devices, whereby said vertical alignment provides commonality of a plurality of circuit connections between the first one of said semiconductor integrated circuit devices and said integrated circuit device in the socket.

10. A mounting socket capable of accepting a gull wing semiconductor integrated circuit device which has a plurality of splayed terminations arranged for surface mounting of the semiconductor integrated circuit device, the socket comprising:

a. the socket including a plurality of vertically oriented electrical connectors and capable of accepting at least one semiconductor integrated circuit device in an inverted position whereby the splayed terminations extend outwardly and in a generally upward direction from a body portion of said additional semiconductor integrated circuit device, the splayed terminations being in ohmic contact with the electrical connectors when the additional semiconductor integrated circuit device is mounted in the socket, the electrical connectors including a surface material sufficiently soft so as to deform upon engagement with the splayed terminations, thereby facilitating ohmic contact; and b. at least two sidewalls extending in a vertical direction, said electrical connectors being formed in an inside surface of said sidewalls, said sidewalls having a plurality of partitions separating said electrical connectors and having a plurality of partitions extending in a vertical direction and inwardly toward the semiconductor integrated circuit device, thereby providing a guide for the splayed terminations of the semiconductor integrated circuit device.

11. The socket of claim 10, further comprising the socket having a depth sufficient to accept a plurality of additional semiconductor integrated circuit devices, including said one additional semiconductor integrated circuit device and further semiconductor integrated circuit devices in a stacked alignment and sharing a plurality of circuit connections.

12. The socket of claim 11, wherein said two sidewalls extending in a vertical direction sufficiently to accept the plurality of semiconductor integrated circuit devices and the vertical partitions extend sufficiently in the vertical direction to permit socketing the semiconductor integrated circuit devices to be accepted by the socket while maintaining separation of the splayed terminations from other splayed terminations on the same semiconductor integrated circuit device.

13. The socket of claim 12 wherein at least one connector location being split so as to separately communicate between vertically aligned splayed terminations on at least a pair of the semiconductor integrated circuit devices.

14. The socket of claim 10 wherein the electrical connectors include surface material capable of establishing a fusion bond subsequent to engagement with the splayed terminations, thereby permitting fusion bonding subsequent to an initial assembly of the circuit board with its components.

15. The socket of claim 10 wherein the socket comprises at least four sidewalls, each of which include electrical connectors for establishing ohmic contact with ones of said splayed terminations.

16. A circuit including a plurality of electrical devices mounted to a printed circuit board, the circuit comprising:

a. a first semiconductor integrated circuit device mounted on a first side of the circuit board and having a plurality of splayed terminations arranged for surface mounting of the semiconductor integrated circuit device to the circuit board, said splayed terminations fusion bonded to the circuit board; and b. a socket mounted on a second, opposite side of the circuit board and including a Plurality of vertically oriented electrical connectors, the socket supporting at least one additional semiconductor integrated circuit device in an inverted position whereby the splayed terminations extend outwardly and in a generally upward direction from a body portion of said additional semiconductor integrated circuit device, the splayed terminations being in ohmic contact with the electrical connectors when the additional semiconductor integrated circuit device is mounted in the socket, the electrical connectors including a surface material sufficiently soft so as to deform upon engagement with the splayed terminations, thereby facilitating ohmic contact, the socket in vertical alignment with the first one of the semiconductor integrated circuit devices, whereby said vertical alignment provides commonality of a plurality of circuit connections between the first one of said semiconductor integrated circuit devices and said integrated circuit device in the socket.

* * * * *